(12) United States Patent
Zhang et al.

(10) Patent No.: US 12,356,549 B2
(45) Date of Patent: Jul. 8, 2025

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Jiaqin Zhang, Beijing (CN); Chang Zhang, Beijing (CN); Chuanyan Lan, Beijing (CN); Qun Jia, Beijing (CN); Yong Yu, Beijing (CN); Yongle Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/921,361

(22) PCT Filed: Nov. 24, 2021

(86) PCT No.: PCT/CN2021/132915
§ 371 (c)(1),
(2) Date: Oct. 26, 2022

(87) PCT Pub. No.: WO2023/092355
PCT Pub. Date: Jun. 1, 2023

(65) Prior Publication Data
US 2024/0397626 A1    Nov. 28, 2024

(51) Int. Cl.
*H05K 1/14* (2006.01)
*H05K 1/02* (2006.01)

(52) U.S. Cl.
CPC .......... *H05K 1/147* (2013.01); *H05K 1/0298* (2013.01); *H05K 2201/10128* (2013.01); *H05K 2201/10151* (2013.01)

(58) Field of Classification Search
CPC ................. H05K 1/147; H05K 1/0298; H05K 2201/10128; H05K 2201/10151
(Continued)

(56) References Cited

U.S. PATENT DOCUMENTS

2010/0283777 A1    11/2010   Sang et al.
2014/0328084 A1*   11/2014   Chuang ................. H01Q 1/243
                                                        361/767
(Continued)

FOREIGN PATENT DOCUMENTS

CN    101887699 A    11/2010
CN    204374561 U    6/2015
(Continued)

*Primary Examiner* — Andargie M Aychillhum
(74) *Attorney, Agent, or Firm* — Ling Wu; Stephen Yang; Ling and Yang Intellectual Property

(57) ABSTRACT

A display panel and a display apparatus. The display panel includes a display substrate, a first printed circuit board and a second printed circuit board, wherein the display substrate includes a display area and a bonding area located on a side of the display area, the bonding area is connected with the first printed circuit board through a first flexible printed circuit, and the first printed circuit board is connected with the second printed circuit board through a second flexible printed circuit; and the first printed circuit board is a wiring circuit board mounted with a signal connection line, the second printed circuit board is a drive circuit board mounted with a drive chip, and an orthographic projection of the second printed circuit board on a plane of the display panel does not overlap with an orthographic projection of the display substrate on the plane of the display panel.

19 Claims, 8 Drawing Sheets

(58) Field of Classification Search
USPC .......................................................... 361/749
See application file for complete search history.

(56) References Cited

U.S. PATENT DOCUMENTS

| | | | |
|---|---|---|---|
| 2017/0108732 A1 | 4/2017 | Oh | |
| 2017/0194411 A1 | 7/2017 | Park et al. | |
| 2019/0011746 A1* | 1/2019 | Que | G02F 1/13452 |
| 2020/0068733 A1 | 2/2020 | Lee et al. | |
| 2020/0117034 A1 | 4/2020 | Yin et al. | |
| 2021/0004101 A1 | 1/2021 | Wei et al. | |
| 2021/0043694 A1 | 2/2021 | Wei et al. | |

FOREIGN PATENT DOCUMENTS

| | | |
|---|---|---|
| CN | 108292710 A | 7/2018 |
| CN | 110853561 A | 2/2020 |
| CN | 110914792 A | 3/2020 |
| CN | 110941112 A | 3/2020 |
| CN | 111028799 A | 4/2020 |
| CN | 212873893 U | 4/2021 |
| CN | 112951133 A | 6/2021 |
| CN | 110914792 B | 8/2021 |
| WO | 2019079952 A1 | 5/2019 |
| WO | 2019183985 A1 | 10/2019 |

* cited by examiner

DISPLAY PANEL AND DISPLAY APPARATUS

CROSS-REFERENCE TO RELATED APPLICATION

The present application is a U.S. National Phase Entry of International Application No. PCT/CN2021/132915 having an international filing date of Nov. 24, 2021, the entire content of which is hereby incorporated by reference.

TECHNICAL FIELD

The present disclosure relates to, but is not limited to, the field of display technology, in particular to a display panel and a display apparatus.

BACKGROUND

An Organic Light Emitting Diode (OLED) and a Quantum-dot Light Emitting Diode (QLED) are active light emitting display devices and have the advantages of self-luminescence, a wide viewing angle, a high contrast ratio, low power consumption, an extremely high response speed, lightness and thinness, flexibility, a low cost, etc. With the constant development of display technology, a display apparatus using an OLED or a QLED as a light emitting device and using a Thin Film Transistor (TFT) for signal control has become a mainstream product in the field of display at present, and has been widely used in mobile phones, notebook computers, televisions, vehicle-mounted displays, smart wearable devices and other fields.

SUMMARY

The following is a summary of subject matters described herein in detail. The summary is not intended to limit the protection scope of claims.

In an aspect, an exemplary embodiment of the present disclosure provides a display panel, including a display substrate, a first printed circuit board and a second printed circuit board, wherein the display substrate includes a display area and a bonding area located on a side of the display area, the bonding area is connected with the first printed circuit board through a first flexible printed circuit, and the first printed circuit board is connected with the second printed circuit board through a second flexible printed circuit; and the first printed circuit board is a wiring circuit board mounted with a signal connection line, the second printed circuit board is a drive circuit board mounted with a drive chip, and an orthographic projection of the second printed circuit board on a plane of the display panel does not overlap with an orthographic projection of the display substrate on the plane of the display panel.

In an exemplary implementation, a first connector is provided on the first printed circuit board, and the second flexible printed circuit is connected with the first printed circuit board through the first connector.

In an exemplary implementation, a second connector is provided on the second printed circuit board, and the second flexible printed circuit is connected with the second printed circuit board through the second connector.

In an exemplary implementation, the first printed circuit board is a single-layer board or a multi-layer board, and the number of layers of the multi-layer board is less than or equal to 3.

In an exemplary implementation, the first printed circuit board includes a first board body and a connection line layer provided on the first board body, a thickness of the first board body is 0.25 mm to 0.35 mm, and a thickness of the connection line layer is 0.15 mm to 0.25 mm.

In an exemplary implementation, the second printed circuit board is a multi-layer board, and the number of layers of the multi-layer board is 8 to 10.

In an exemplary implementation, the second printed circuit board includes a second board body and an electronic device layer provided on the second board body, a thickness of the second board body is 0.8 mm to 1.2 mm, and a thickness of the electronic device layer is 1.5 mm to 2.5 mm.

In an exemplary implementation, the electronic device layer at least includes a first chip region, a second chip region and a third chip region arranged at intervals, the first chip region is configured to provide a timing control chip and a peripheral circuit thereof, the second chip region is configured to provide a power management chip and a peripheral circuit thereof, and the third chip region is configured to provide a power supply management chip and a peripheral circuit thereof.

In an exemplary implementation, the second printed circuit board further includes at least one silicone pad attached to a surface of the timing control chip, the power management chip, or the power supply management chip.

In an exemplary implementation, the second printed circuit board further includes at least one temperature sensor, the temperature sensor is provided in the first chip region and adjacent to the timing control chip; and/or, the temperature sensor is provided in the second chip region and adjacent to the power management chip; and/or, the temperature sensor is provided in the third chip region and adjacent to the power supply management chip.

In an exemplary implementation, the bonding area includes a chip region and a pin region that are sequentially arranged in a direction away from the display area, the pin region includes a plurality of pins, and the first flexible printed circuit is arranged on a side of the pin region away from the display area and is bonding-connected with the plurality of pins in the pin region.

In an exemplary implementation, the first printed circuit board is arranged on a side of the first flexible printed circuit away from the display area, and an orthographic projection of the first printed circuit board on the plane of the display panel does not overlap with the orthographic projection of the display substrate on the plane of the display panel.

In an exemplary implementation, the bonding area includes a bending region, a chip region and a pin region that are sequentially arranged in a direction away from the display area, the bending region is configured to turn over the chip region and the pin region to a back of the display area by bending, the pin region includes a plurality of pins, and the first flexible printed circuit is arranged on a side of the pin region close to the display area and is bonding-connected with the plurality of pins in the pin region.

In an exemplary implementation, the first printed circuit board is arranged on a side of the first flexible printed circuit close to the display area, and the orthographic projection of the first printed circuit board on the plane of the display panel at least partially overlaps with an orthographic projection of the display area on the plane of the display panel.

In another aspect, an exemplary embodiment of the present disclosure further provides a display apparatus, including the above-mentioned display panel.

In an exemplary implementation, the display apparatus further includes a host, the host and the display panel are connected through a rotation shaft, and the second flexible printed circuit is provided in the rotation shaft.

In an exemplary implementation, the host includes a motherboard, a keyboard and a battery, and the second printed circuit board is fixed on the motherboard, or the second printed circuit board is arranged between the keyboard and the battery.

Other aspects may be comprehended upon reading and understanding drawings and detailed descriptions.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure, but do not constitute limitations on the technical solutions of the present disclosure. Shapes and sizes of various components in the drawings do not reflect actual scales, but are only intended to schematically illustrate contents of the present disclosure.

DESCRIPTION OF REFERENCE SIGNS

Figure 1:
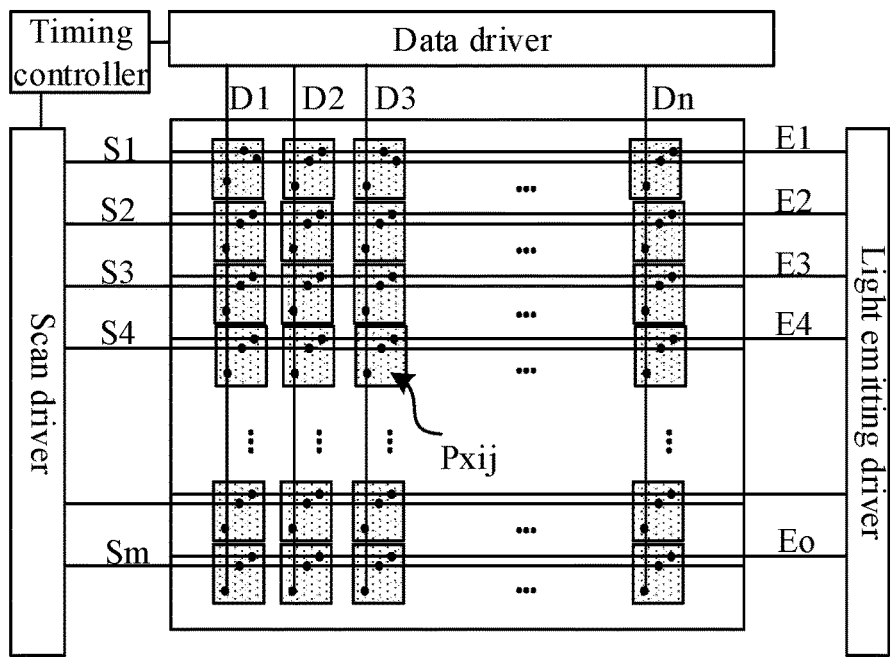
FIG. 1 is a schematic diagram of a structure of a display apparatus.

10—display substrate; 11—polarization layer; 12—adhesive layer; 13—protective layer; 20—source drive chip; 21—back film layer; 22—heat dissipation layer; 23—spacer layer; 24—backing adhesive; 30—flexible printed circuit; 31—first flexible printed circuit; 32—second flexible printed circuit; 33—third flexible printed circuit; 40—printed circuit board; 41—first printed circuit board; 42—second printed circuit board; 50—fixing tape; 61—first connector; 62—second connector; 63—connection interface; 81—first chip region; 82—second chip region; 83—third chip region; 84—first interface region; 85—second interface region; 91—fixing hole; 92—silicone pad; 93—temperature sensor; 100—display area; 101—base substrate; 102—drive circuit layer; 104—encapsulation layer; 200—bonding area; 201—bending region; 210—chip region; 220—pin region; 300—border area; 301—anode; 302—pixel definition layer; 303—organic light emitting layer; 304—cathode; 401—first encapsulation layer; 402—second encapsulation layer; and 403—third encapsulation layer.

DETAILED DESCRIPTION

To make objectives, technical solutions, and advantages of the present disclosure clearer, the embodiments of the present disclosure will be described in detail below with reference to the accompanying drawings. It is to be noted that implementations may be carried out in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other without conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and for other structures, reference may be made to usual designs.

Scales of the drawings in the present disclosure may be used as a reference in the actual process, but are not used for limitation. For example, the width-length ratio of the channel, the thickness and spacing of each film layer, and the width and spacing of each signal line may be adjusted according to actual needs. The number of pixels in the display substrate and the number of sub-pixels in each pixel are not limited to the number shown in the drawings. The drawings described in the present disclosure are schematic structure diagrams only, and one implementation of the present disclosure is not limited to the shapes, numerical values or the like shown in the drawings.

Ordinal numerals such as "first", "second", and "third" in the specification are set to avoid confusion of constituent elements, but not to set a limit in quantity.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed appropriately according to directions for describing the constituent elements. Therefore, appropriate replacements can be made according to situations without being limited to the wordings described in the specification.

In the specification, unless otherwise specified and defined explicitly, terms "mount", "mutually connect", and "connect" should be understood in a broad sense, which, for example, may be a fixed connection, or a detachable connection, or an integrated connection; may be a mechanical connection or an electrical connection; may be a direct mutual connection, or an indirect connection through middleware, or internal communication between two elements. Those of ordinary skills in the art may understand specific meanings of these terms in the present disclosure according to specific situations.

In the specification, a transistor refers to an element which at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source electrode. It is to be noted that, in the specification, the channel region refers to a region through which the current mainly flows.

In the specification, a first electrode may be the drain electrode, and a second electrode may be the source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchanged. Therefore, the "source electrode" and the "drain electrode" are interchangeable in the specification.

In the specification, "electrical connection" includes a case that constituent elements are connected together through an element with a certain electrical effect. The "element with a certain electrical effect" is not particularly limited as long as electrical signals may be sent and received between the connected constituent elements. Examples of the "element with a certain electrical effect" not only include electrodes and wirings, but also include switch elements such as transistors, resistors, inductors, capacitors, other elements with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulating film" may be replaced with an "insulating layer" sometimes.

Triangle, rectangle, trapezoid, pentagon or hexagon, etc. in this specification is not strictly defined, but may be approximate triangle, rectangle, trapezoid, pentagon or hexagon, etc. There may be some small deformations caused by tolerance, and there may be chamfer, arc edge and deformation, etc.

In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver and a pixel array. The timing controller is connected to the data driver, the scan driver and the light emitting driver, respectively, the data driver is connected to a plurality of data signal lines (D1 to Dn) respectively, the scan driver is connected to a plurality of scan signal lines (S1 to Sm) respectively, and the light emitting driver is connected to a plurality of light emitting signal lines (E1 to Eo) respectively. The pixel array may include a plurality of sub-pixels Pxij, i and j may be natural numbers, at least one sub-pixel Pxij may include a circuit unit and a light emitting device connected to the circuit unit, and the circuit unit may include at least one scan signal line, at least one data signal line, at least one light emitting signal line and a pixel drive circuit. In an exemplary implementation, the timing controller may provide a gray tone value and a control signal, which are suitable for a specification of the data driver, to the data driver, provide a clock signal, a scan start signal, etc., which are suitable for a specification of the scan driver, to the scan driver, and provide a clock signal, a transmit stop signal, etc., which are suitable for a specification of the light emitting driver, to the light emitting driver. The data driver may generate a data voltage to be provided to the data signal lines D1, D2, D3, . . . , and Dn by using the gray tone value and the control signal that are received from the timing controller. For example, the data driver may sample the gray tone value by using the clock signal and apply a data voltage corresponding to the gray tone value to the data signal lines D1 to Dn by taking a pixel row as a unit, wherein n may be a natural number. The scan driver may receive the clock signal, the scan start signal, etc., from the timing controller to generate a scan signal to be provided to the scan signal lines S1, S2, S3, . . . , and Sm. For example, the scan driver may provide a scan signal with an on-level pulse to the scan signal lines S1 to Sm sequentially. For example, the scan driver may be constructed in a form of a shift register and may generate a scan signal in a manner in which the scan start signal provided in a form of an on-level pulse is transmitted to a next-stage circuit sequentially under the control of the clock signal, wherein m may be a natural number. The light emitting driver may receive a clock signal, a transmit stop signal, etc., from the timing controller to generate a transmit signal to be provided to the light emitting signal lines E1, E2, E3, . . . , and Eo. For example, the light emitting driver may provide a transmit signal with an off-level pulse to the light emitting signal lines E1 to Eo sequentially. For example, the light emitting driver may be constructed in a form of a shift register and may generate a transmit signal in a manner in which the transmit stop signal provided in a form of an off-level pulse is transmitted to a next-stage circuit sequentially under the control of the clock signal, wherein o may be a natural number.

Figure 2:
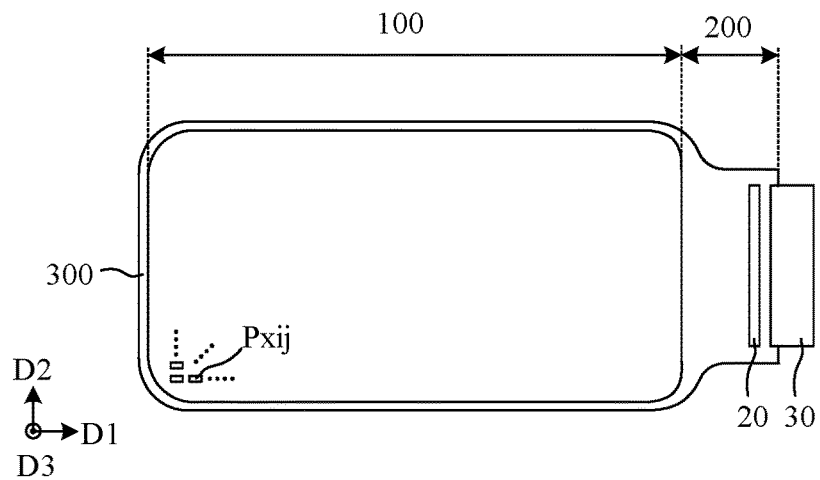
FIG. 2 is a schematic diagram of a planar structure of a display panel.

FIG. 2 is a schematic diagram of a planar structure of a display panel. As shown in FIG. 2, the display panel may include a display area 100, a bonding area 200 on a side of the display area 100 in a first direction D1, and a border area 300 on other sides of the display area 100. The display area 100 may at least include a plurality of sub-pixels Pxij forming a pixel array to display a dynamic picture or a static image. The bonding area 200 may at least include a plurality of signal leads, a Source Driver IC (SDIC) 20 and a plurality of pins. The plurality of signal leads are configured to connect a plurality of data signal lines in the display area 100 to the SDIC 20, the SDIC 20 is configured to generate a drive signal for driving display, which is supplied to the sub-pixels in the display area 100 through the plurality of signal leads, and the plurality of pins are configured to be bonding-connected to a Flexible Printed Circuit (FPC) 30. The border area 300 may at least include a gate drive circuit and a power line. The gate drive circuit is configured to generate and supply a scan signal and a transmit signal to the sub-pixels in the display area 100, and the power line is configured to transmit a voltage signal to the sub-pixels in the display area 100. In an exemplary implementation, the bonding area 200 and the border area 300 may include an isolation dam having an annular structure, which is not limited here in the present disclosure.

In an exemplary implementation, the bonding area 200 may at least include a chip region and a pin region arranged sequentially in a first direction D1 (a direction away from the display area), the chip region may at least include a plurality of pads, an SDIC 20 may be bonding-connected to the plurality of pads in the chip region, the pin region may at least include a plurality of pins, and the FPC 30 may be bonding-connected to the plurality of pins in the pin region. In an exemplary implementation, widths of the SDIC 20 and the FPC 30 in a second direction D2 may be less than a width of the bonding area 200 in the second direction D2, the second direction D2 intersecting with the first direction D1.

Figure 3:
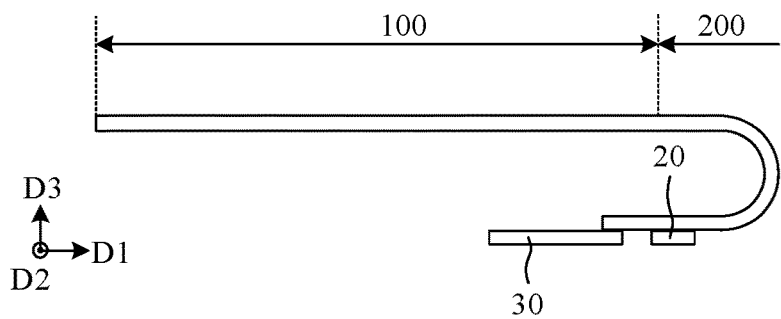
FIG. 3 is a schematic diagram of a side structure of another display panel.

FIG. 3 is a schematic diagram of a side structure of another display panel. As shown in FIG. 3, the display panel may include a display area 100, a bonding area 200 and a border area. The structures of the display area 100 and the border area are substantially the same as the structures shown in FIG. 2, and the bonding area 200 may include a bending region, a chip region and a pin region arranged sequentially in the first direction D1. The bending region may be bent with a curvature in a third direction D3, so that surfaces of the chip region and the pin region may be turned over, i.e., upward-facing surfaces of the chip region and the pin region may be changed to face downwards by the bending of the bending region, the third direction D3 intersecting with the first direction D1. In an exemplary implementation, when the bending region is bent, the chip region and the pin region may be overlapped with the display area 100 in the third direction D3 (a thickness direction).

In an exemplary implementation, the display panel may be deformable, e.g., may be crimped, bent, folded, or curled.

In an exemplary implementation, the first direction D1 may be an extension direction (a column direction) of the data signal lines in the display area, the second direction D2 may be an extension direction (a row direction) of the scan signal lines in the display area, the third direction D3 may be a direction perpendicular to the plane of the display panel, the first direction D1 and the second direction D2 may be perpendicular to each other, and the first direction D1 and the third direction D3 may be perpendicular to each other.

Figure 4:
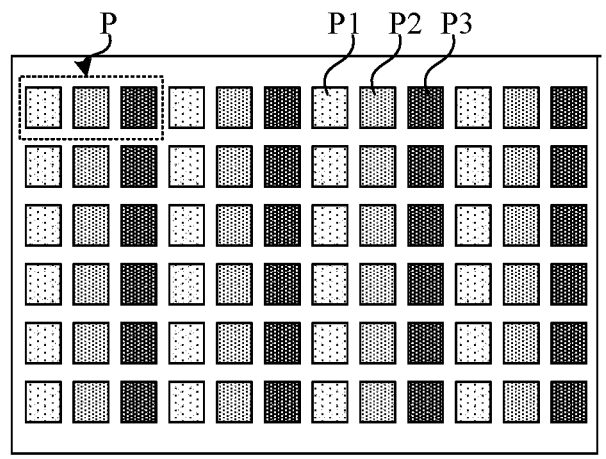
FIG. 4 is a schematic diagram of a planar structure of a display area in a display panel.

FIG. 4 is a schematic diagram of a planar structure of a display area in a display panel. As shown in FIG. 4, the display area may include a plurality of pixel units P arranged in a matrix, and at least one of the plurality of pixel units P may include a first sub-pixel P1 emitting light of a first color, a second sub-pixel P2 emitting light of a second color, and a third sub-pixel P3 emitting light of a third color. The three sub-pixels may each include a pixel drive circuit and a light emitting device. The pixel drive circuit is respectively connected to a scan signal line, a data signal line and a light emitting signal line, and the pixel drive circuit is configured to receive a data voltage transmitted by the data signal line and output a corresponding current to the light emitting device, under the control of the scan signal line and the light emitting signal line. The light emitting device is connected to a pixel drive circuit of a sub-pixel in which the light emitting device is located, and the light emitting device is configured to emit light of corresponding brightness in response to a current output by the pixel drive circuit of the sub-pixel in which the light emitting device is located.

In an exemplary implementation, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light. In an exemplary implementation, a shape of the sub-pixel in the pixel unit may be a rectangle, a rhombus, a pentagon, a hexagon, a circle, an ellipse, or the like, and the sub-pixels may be arranged side by side horizontally, side by side vertically, in a shape of a Chinese character "品", or the like, which is not limited here in the present disclosure.

In an exemplary implementation, the pixel unit may include four sub-pixels, and the four sub-pixels may be arranged side by side horizontally, side by side vertically, in a square, in a diamond shape, or the like, which is not limited here in the present disclosure.

Figure 5:
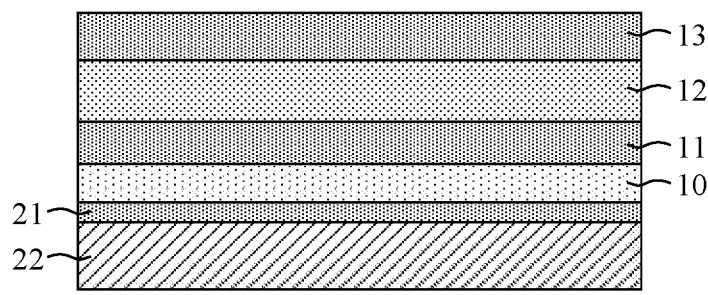
FIG. 5 is a schematic diagram of a sectional structure of a display area in a display panel.

FIG. 5 is a schematic diagram of a sectional structure of a display area in a display panel. As shown in FIG. 5, in a plane perpendicular to the display panel, the display panel may include: a heat dissipation layer 22, a back film layer 21, a display substrate 10, a polarization layer 11, an adhesive layer 12 and a protective layer 13 in a bottom-up direction.

In an exemplary implementation, the display substrate 10 is configured to display a dynamic picture or a static image, the polarization layer 11 is configured to reduce reflection of external ambient light, the protective layer 13 is configured to protect the display panel and is attached to the polarization layer 11 through the adhesive layer 12, the back film layer 21 is configured to protect the display substrate 10, and the heat dissipation layer 22 is configured to improve the heat dissipation performance of the display substrate 10.

Figure 6:
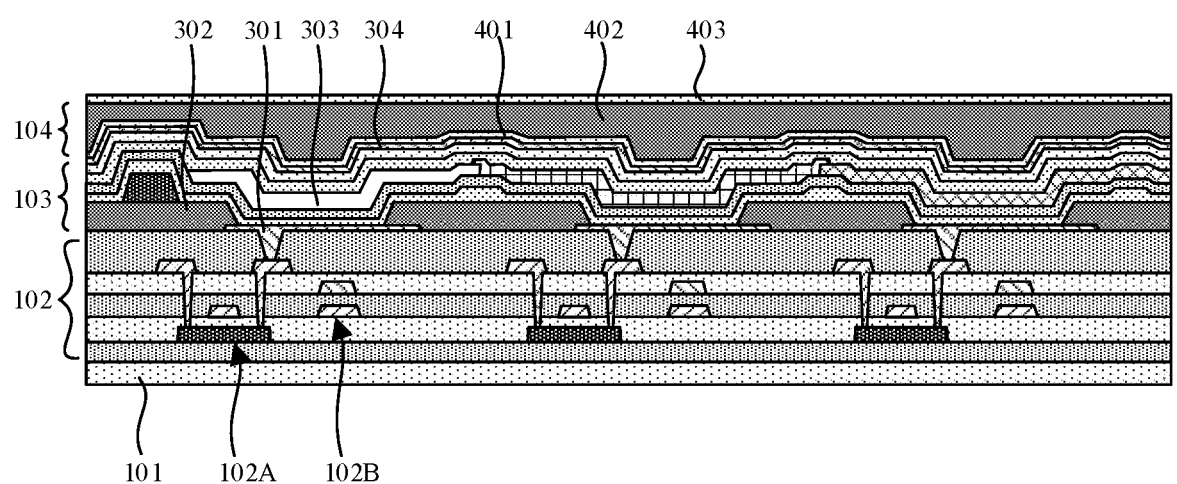
FIG. 6 is a schematic diagram of a sectional structure of a display substrate in a display panel.

FIG. 6 is a schematic diagram of a sectional structure of a display substrate in a display panel, illustrating a structure of three sub-pixels in the display area. As shown in FIG. 6, on a plane perpendicular to the display panel, the display substrate may include a drive circuit layer 102 arranged on a base substrate 101, a light emitting structure layer 103 arranged on a side of the drive circuit layer 102 away from the base substrate 101, and an encapsulation layer 104 arranged on a side of the light emitting structure layer 103 away from the base substrate 101. In some possible implementations, the display area may include other film layers, such as a touch structure layer, which is not limited here in the present disclosure.

In an exemplary implementation, the base substrate 101 may be a flexible base substrate, or a rigid base substrate. The drive circuit layer 102 of each sub-pixel may include a plurality of transistors and a storage capacitor that form a pixel drive circuit. In FIG. 6, for example, the pixel drive circuit includes one transistor 102A and one storage capacitor 102B. The light emitting structure layer 103 may include an anode 301, a pixel definition layer 302, an organic light emitting layer 303, and a cathode 304. The anode 301 is connected with a second electrode of the transistor 102A through a via hole, the organic light emitting layer 303 is connected with the anode 301, the cathode 304 is connected with the organic light emitting layer 303, and the organic light emitting layer 303 emits light of a corresponding color under driving of the anode 301 and the cathode 304. The encapsulation layer 104 may include a first encapsulation layer 401, a second encapsulation layer 402, and a third encapsulation layer 403 that are stacked, wherein the first encapsulation layer 401 and the third encapsulation layer 403 may be made of an inorganic material, the second encapsulation layer 402 may be made of an organic material, and the second encapsulation layer 402 is arranged between the first encapsulation layer 401 and the third encapsulation layer 403, which may ensure that external water vapor cannot enter the light emitting structure layer 103.

In an exemplary implementation, the organic light emitting layer 303 may include an emitting layer (EML), and any one or more of following layers: a hole injection layer (HIL), a hole transport layer (HTL), an electron block layer (EBL), a hole block layer (HBL), an electron transport layer (ETL), and an electron injection layer (EIL). In an exemplary implementation, hole injection layers, hole transport layers, electron block layers, hole block layers and electron injection layers of all sub-pixels may be connected together to form a common layer. Emitting layers of adjacent sub-pixels may be overlapped slightly, or may be isolated.

Figure 7:
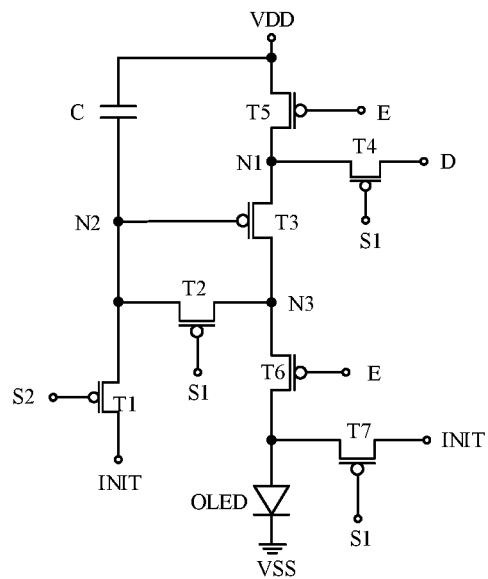
FIG. 7 is a schematic diagram of an equivalent circuit of a pixel drive circuit.

FIG. 7 is a schematic diagram of an equivalent circuit of a pixel drive circuit. In an exemplary implementation, the pixel drive circuit may be in a 3T1C, 4T1C, 5T1C, 5T2C, 6T1C, or 7T1C structure. As shown in FIG. 7, the pixel drive circuit may include seven transistors (a first transistor T1 to a seventh transistor T7) and one storage capacitor C, and the pixel drive circuit may be connected with seven signal lines (a data signal line D, a first scan signal line S1, a second scan signal line S2, a light emitting signal line E, an initial signal line INIT, a first power line VDD, and a second power line VSS).

In an exemplary implementation, the pixel drive circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the first transistor, a first electrode of the second transistor T2, a control electrode of the third transistor T3, and a second end of the storage capacitor C, and the third node N3 is respectively connected with a second electrode of the second transistor T2, a second electrode of the third transistor T3, and a first electrode of the sixth transistor T6.

In an exemplary implementation, a first end of the storage capacitor C is connected with the first power line VDD, and the second end of the storage capacitor C is connected with the second node N2, i.e., the second end of the storage capacitor C is connected with the control electrode of the third transistor T3.

A control electrode of the first transistor T1 is connected with the second scan signal line S2, a first electrode of the first transistor T1 is connected with an initial signal line INIT, and the second electrode of the first transistor is connected with the second node N2. When a scan signal with an on-level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with an on-level is applied to the first scan signal line S1, the second transistor T2 enables the control electrode of the third transistor T3 to be connected with a second electrode of the third transistor T3.

The control electrode of the third transistor T3 is connected with the second node N2, i.e., the control electrode of the third transistor T3 is connected with the second end of the storage capacitor C, a first electrode of the third transistor T3 is connected with the first node N1, and the second electrode of the third transistor T3 is connected with the third node N3. The third transistor T3 may be referred to as a drive transistor, and the third transistor T3 determines an amount of a drive current flowing between the first power line VDD and the second power line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and a second electrode of the fourth transistor T4 is connected with the first node N1. The fourth transistor T4 may be referred to as a switch transistor, a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power line VDD and the second power line VSS.

A control electrode of the seventh transistor T7 is connected with the first scan signal line S1, a first electrode of the seventh transistor T7 is connected with the initial signal line INIT, and a second electrode of the seventh transistor T7 is connected with the first electrode of the light emitting device. When a scan signal with an on-level is applied to the first scan signal line S1, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary implementation, a second electrode of the light emitting device is connected with the second power line VSS, a signal of the second power line VSS is a low-level signal, and a signal of the first power line VDD is a high-level signal continuously provided. The first scan signal line S1 is a scan signal line in a pixel drive circuit of a current display row, and the second scan signal line S2 is a scan signal line in a pixel drive circuit of a previous display row. That is, for an n-th display row, the first scan signal line S1 is S(n), and the second scan signal line S2 is S(n−1). The second scan signal line S2 of the current display row and the first scan signal line S1 in the pixel drive circuit of the previous display row are a same signal line, thus signal lines of the display panel may be reduced, so that a narrow border of the display panel is achieved.

In an exemplary implementation, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementations, the first transistor T1 to the seventh transistor T7 may include a P-type transistor and an N-type transistor.

In an exemplary implementation, the first scan signal line S1, the second scan signal line S2, the light emitting signal line E, and the initial signal line INIT extend in a horizontal direction, and the second power line VSS, the first power line VDD, and the data signal line D extend in a vertical direction.

In an exemplary implementation, the light emitting device may be an organic light emitting diode (OLED), including a first electrode (anode), an organic light emitting layer, and a second electrode (cathode) that are stacked.

Figure 8:
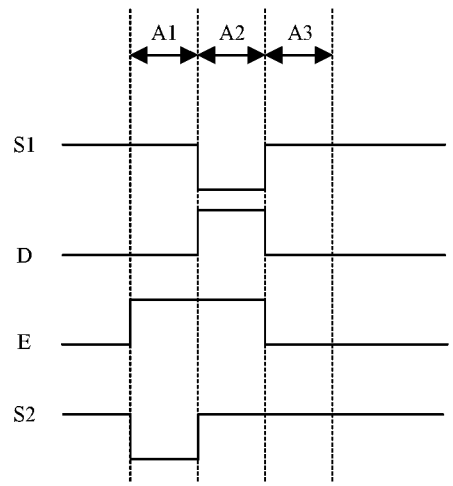
FIG. 8 is a working timing diagram of a pixel drive circuit.

FIG. 8 is a working timing diagram of a pixel drive circuit. An exemplary embodiment of the present disclosure will be described below through a working process of the pixel drive circuit exemplified in FIG. 7. The pixel drive circuit in FIG. 7 includes seven transistors (a first transistor T1 to a seventh transistor T7) and one storage capacitor C, and the seven transistors are all P-type transistors.

In an exemplary implementation, the working process of the pixel drive circuit may include following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is a low-level signal, so that the first transistor T1 is turned on, and a signal of the initial signal line INIT is provided to a second node N2 to initialize the storage capacitor C to clear an original data voltage in the storage capacitor. The signals of the first scan signal line S1 and the light emitting signal line E are high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, the signal of the first scan signal line S1 is a low-level signal, signals of the second scan signal line S2 and the light emitting signal line E are high-level signals, and the data signal line D outputs a data voltage. In this stage, a second end of the storage capacitor C is at a low level, so the third transistor T3 is turned on. The signal of the first scan signal line S1 is a low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 through a first node N1, the turned-on third transistor T3, a third node N3, and the turned-on second transistor T2, and the storage capacitor C is charged with a difference between the data voltage output by the data signal line D and a threshold voltage of the third transistor T3. A voltage at the second end (the second node N2) of the storage capacitor C is Vd−|Vth|, wherein Vd is the data voltage output by the data signal line D, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization to ensure that the OLED does not emit light. The signal of the second scan signal line S2 is a high-level signal, so that the first transistor T1 is turned off. The signal of the light emitting signal line E is a high-level signal, so that the fifth transistor T5 and the sixth transistor T6 are turned off.

In a third stage A3, referred to as a light emitting stage, the signal of the light emitting signal line E is a low-level signal, and the signals of the first scan signal line S1 and the second scan signal line S2 are high-level signals. The signal of the light emitting signal line E is a low-level signal, so that the fifth transistor T5 and the sixth transistor T6 are turned on, and a power voltage output by the first power line VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vdata−|Vth|, so the drive current of the third transistor T3 is as follows.

$$I = K^*(Vgs-Vth)^2 = K^*[(Vdd-Vd+|Vth|)-Vth]^2 = K^*[(Vdd-Vd)]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power line VDD.

Figure 9:
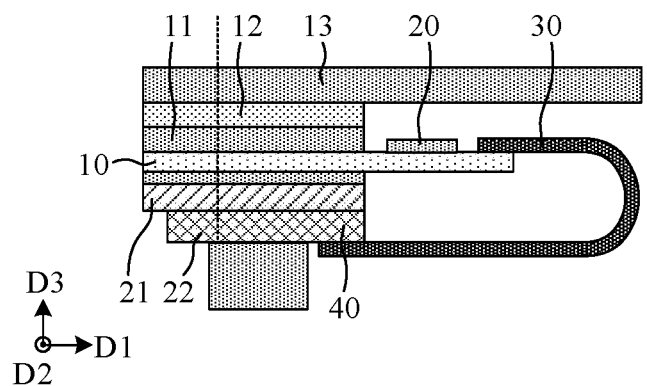
FIG. 9 is a schematic diagram of a mounting structure of a printed circuit board in a display panel.

FIG. 9 is a schematic diagram of a mounting structure of a printed circuit board in a display panel. As shown in FIG. 9, the bonding area of the display panel may at least include an SDIC 20 and a pin, the pin is connected to one end of a flexible printed circuit 30, and the other end of the flexible printed circuit 30 is bent to the back of the display panel to be connected to a printed circuit board (PCB) 40. An electronic device is arranged on the PCB 40, and the electronic device at least includes a timing control (T-con) chip, a power management chip (PMIC), a power supply management chip (ELIC), a memory (Flash), etc.

In an exemplary implementation, the display panel may include a heat dissipation layer 22, a back film layer 21, a display substrate 10, a polarization layer 11, an adhesive layer 12 and a protective layer 13 that are stacked, the PCB 40 may be attached to a side of the heat dissipation layer 22 away from the display substrate 10, and the electronic device may be arranged on a side of the PCB 40 away from the display substrate 10.

In an exemplary implementation, a thickness of the PCB 40 may be about 1.0 mm and a thickness of the electronic device may be about 1.5 mm to 2.5 mm. As can be seen from the structure shown in FIG. 9, the overall thickness of the display panel is relatively large, about 3.2 mm to 4.4 mm, due to the relatively large thicknesses of the PCB 40 and the electronic device.

With the technological innovation and consumption evolution, the Frame Rate (FR) of a display apparatus has gradually increased from 60 Hz to 90 Hz, 120 Hz, 144 Hz, 240 Hz and so on. The increase in frame rate leads to a large increase in power consumption and heat generation of drive chips (such as T-con, PMIC, etc.). Since the PCB and the electronic device in the structure of the display panel shown in FIG. 9 are arranged on the back of the display panel, when the display panel works, heat generated by the electronic device is transferred to the display panel through the PCB, which causes the temperature at a corresponding position of the display panel to rise rapidly, not only causing an offset in the characteristics of the pixel drive circuit on the display panel, but also reducing the service life of a light emitting device on the display panel. For example, when the temperature rises, the characteristic of a threshold voltage Vth of a transistor (TFT) in the pixel drive circuit is positively offset, and as a result, under the condition where the drive voltage is unchanged, the opening of a channel of the TFT is increased and a drive current flowing through the light emitting device is increased, which directly causes an increase in light emitting intensity. Even if offsets in the characteristics of Vth of an R sub-pixel, a G sub-pixel and a B sub-pixel are the same, due to differences in opening rates and luminous efficiencies of the R sub-pixel, the G sub-pixel and the B sub-pixel, the ratio of light emitting intensities of the R sub-pixel, the G sub-pixel and the B sub-pixel is out of balance, resulting in a deviation from the original luminance and color coordinates. For another example, the service life of the light emitting device is highly related to the total light emitting intensity and the total light emitting time; and as the temperature rises, the light emitting intensity increases, and as time goes by, the effect of the increase of light emitting intensity is superimposed, thus accelerating the aging of the light emitting device and reducing the service life.

An exemplary embodiment of the present disclosure provides a display panel, including a display substrate, a first printed circuit board and a second printed circuit board, wherein the display substrate includes a display area and a bonding area located on a side of the display area, the bonding area is connected with the first printed circuit board through a first flexible printed circuit, and the first printed circuit board is connected with the second printed circuit board through a second flexible printed circuit; and the first printed circuit board is a wiring circuit board mounted with a signal connection line, the second printed circuit board is a drive circuit board mounted with a drive chip, and an orthographic projection of the second printed circuit board on a plane of the display panel does not overlap with an orthographic projection of the display substrate on the plane of the display panel.

In an exemplary implementation, the bonding area includes a chip region and a pin region that are sequentially arranged in a direction away from the display area, the pin region includes a plurality of pins, and the first flexible printed circuit is arranged on a side of the pin region away from the display area and is bonding-connected with the plurality of pins in the pin region. The first printed circuit board is arranged on a side of the first flexible printed circuit away from the display area, and an orthographic projection of the first printed circuit board on the plane of the display panel does not overlap with the orthographic projection of the display substrate on the plane of the display panel.

In an exemplary implementation, the bonding area includes a bending region, a chip region and a pin region that are sequentially arranged in a direction away from the display area, the bending region is configured to turn over the chip region and the pin region to a back of the display area by bending, the pin region includes a plurality of pins, and the first flexible printed circuit is arranged on a side of the pin region close to the display area and is bonding-connected with the plurality of pins in the pin region. The first printed circuit board is arranged on a side of the first flexible printed circuit close to the display area, and the orthographic projection of the first printed circuit board on the plane of the display panel at least partially overlaps with the orthographic projection of the display substrate on the plane of the display panel.

In an exemplary implementation, the first printed circuit board includes a first board body and a connection line layer arranged on the first board body, a thickness of the first board body is 0.25 mm to 0.35 mm, and a thickness of the connection line layer is 0.15 mm to 0.25 mm.

In an exemplary implementation, the second printed circuit board includes a second board body and an electronic device layer arranged on the second board body, a thickness of the second board body is 0.8 mm to 1.2 mm, and a thickness of the electronic device layer is 1.5 mm to 2.5 mm.

Figure 10:
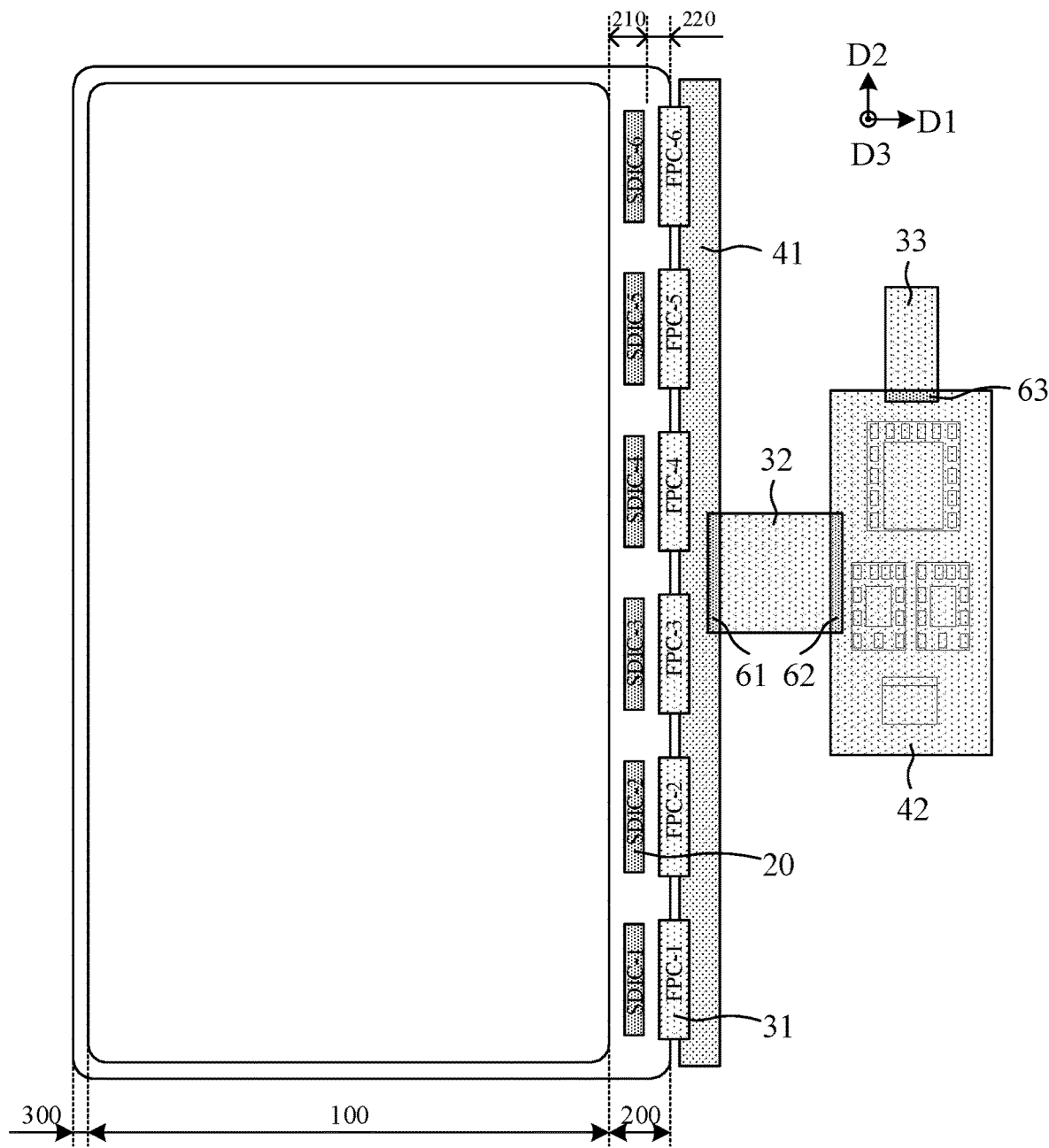
FIG. 10 is a schematic diagram of a planar structure of a display panel according to an exemplary embodiment of the present disclosure.
Figure 11:
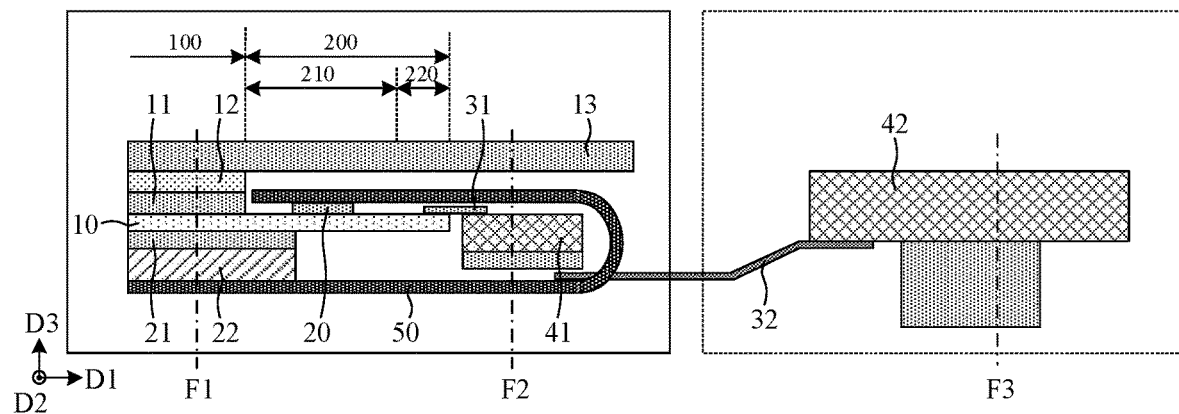
FIG. 11 is a side view of the display panel shown in FIG. 10.

FIG. 10 is a schematic diagram of a planar structure of a display panel according to an exemplary embodiment of the present disclosure, and FIG. 11 is a side view of the display panel shown in FIG. 10. As shown in FIG. 10 and FIG. 11, in a plane parallel to the display panel, the display panel may include a display area 100, a bonding area 200 on a side of the display area 100 in the first direction D1, and a border area 300 on other sides of the display area 100. The bonding area 200 may include a chip region 210 and a pin region 220 arranged sequentially in the first direction D1. The chip region 210 may at least include a plurality of pads. A plurality of SDIC chips 20 are respectively bonding-connected to the plurality of pads in the chip region 210. The pin region 220 may at least include a plurality of pins. First ends of a plurality of first flexible printed circuits 31 are respectively bonding-connected to the plurality of pins in the pin region 220, second ends of the plurality of first flexible printed circuits 31 are all connected to a first end of the first printed circuit board 41, and a second end of the first printed circuit board 41 is connected to the second printed circuit board 42 through a second flexible printed circuit 32.

In an exemplary implementation, six SDIC chips 20 may be arranged in the chip region 210, the six SDIC chips 20 may be sequentially arranged in the second direction D2, and the SDIC chips 20 may be bonding-connected to the chip region 210 in a Chip On Panel (COP) manner. The pin region 220 may be bonding-connected to six first flexible printed circuits 31, and the six first flexible printed circuits 31 may be respectively located on a side of the six SDIC chips 20 in the first direction D1, and the first end of the first flexible printed circuit 31 may be bonding-connected to the pin region 220 in a COP manner.

In an exemplary implementation, the second end of the first flexible printed circuit 31 may be connected to the first printed circuit board 41 in a COP manner.

In an exemplary implementation, the first printed circuit board 41 and the second flexible printed circuit 32 may be connected in a COP manner or may be connected in a connector mode. For example, a first connector 61 may be arranged on a side of the first printed circuit board 41 away from the display area, and the first end of the second flexible printed circuit 32 may be directly inserted into the first connector 61 to realize connection between the first printed circuit board 41 and the second flexible printed circuit 32. In the present disclosure, the first printed circuit board 41 and the second flexible printed circuit 32 are connected in a connector mode, which may facilitate debugging and correction of the display panel in the later production and assembly processes.

In an exemplary implementation, the second flexible printed circuit 32 and the second printed circuit board 42 may be connected in a COP manner or may be connected in a connector mode. For example, a second connector 62 may be arranged on a side of the second printed circuit board 42 close to the display area, and the second end of the second flexible printed circuit 32 may be directly inserted into the second connector 62 to realize connection between the second flexible printed circuit 32 and the second printed circuit board 42. In the present disclosure, the second flexible printed circuit 32 and the second printed circuit board 42 are connected in a connector mode, which may facilitate debugging and correction of the display panel in the later production and assembly processes.

In an exemplary implementation, the connector mode may be a Zero Insertion Force (ZIF) connection mode.

In an exemplary implementation, the second printed circuit board 42 may further include a connection interface 63 configured to be connected to a host of a display apparatus through a cable television cable (Cable line) or a third flexible printed circuit 33.

In an exemplary implementation, in a plane perpendicular to the display panel, the display panel may include a display substrate 10, a polarization layer 11 arranged on the display substrate 10, an adhesive layer 12 arranged on a side of the polarization layer 11 away from the display substrate 10, a protective layer 13 arranged on a side of the adhesive layer 12 away from the display substrate 10, a back film layer 21 arranged on a side of the display substrate 10 away from the protective layer 13, and a heat dissipation layer 22 arranged on a side of the back film layer 21 away from the display substrate 10.

In an exemplary implementation, the polarization layer 11 and the adhesive layer 12 may be located only in the display area 100, the back film layer 21 and the heat dissipation layer 22 may be located in the display area 100 and a portion of the bonding area 200 close to the display area 100, and the protective layer 13 may be located in the entire display area 100 and the entire bonding area 200.

In an exemplary implementation, the display substrate 10 is configured to display a dynamic picture or a static image, and may include a drive circuit layer, a light emitting structure layer and an encapsulation layer that are stacked on a base substrate, and a thickness of the display substrate 10 may be about 0.10 mm to 0.14 mm. For example, the thickness of the display substrate 10 may be about 0.12 mm.

In an exemplary implementation, the polarization layer 11 may act as an anti-reflection layer configured to reduce reflection of external ambient light. The polarization layer 11 may be formed by a patterning process or may be formed by attaching a polarizer. A thickness of the polarization layer 11 may be about 0.10 mm to 0.20 mm. For example, the thickness of the polarization layer 11 may be about 0.15 mm.

In an exemplary implementation, the adhesive layer 12 may adopt an optical clear adhesive (OCA), and a thickness of the adhesive layer 12 may be about 0.15 mm to 0.25 mm. For example, the thickness of the adhesive layer 12 may be about 0.2 mm.

In an exemplary implementation, the protective layer 13 may be Cover Glass (CG) or may be plastic type Colorless Polyimide (CPI).

In an exemplary implementation, a thickness of the cover glass may be about 0.55 mm to 0.65 mm, and a thickness of the colorless polyimide may be about 0.05 mm to 0.07 mm. For example, the thickness of the cover glass may be about 0.6 mm, and the thickness of the colorless polyimide may be about 0.06 mm.

In an exemplary implementation, a thickness of the back film layer (U-Film) 21 may be about 0.04 mm to 0.06 mm. For example, the thickness of the back film layer 21 may be about 0.05 mm.

In an exemplary implementation, a thickness of the heat dissipation layer (SCF) 22 may be about 0.15 mm to 0.25 mm. For example, the thickness of the heat dissipation layer 22 may be about 0.2 mm.

In an exemplary implementation, the plurality of pins and the plurality of pads in the bonding area 200 may be arranged on a surface of a side of the bonding area 200 in the third direction D3 (upper surface). The SDIC chip 20 may be arranged on a side of the bonding area 200 in the third direction D3 (upper surface) and bonding-connected to the plurality of pads. The first end of the first flexible printed circuit 31 may be arranged on a side of the pin region 220 in the third direction D3, and bonding-connected to the plurality of pins, the second end of the first flexible printed circuit 31 extends in the first direction D1 and then is connected with the first printed circuit board 41, i.e., the first printed circuit board 41 is located on a side of the bonding area 200 away from the display area 100, and the orthographic projection of the first printed circuit board 41 on the plane of the display panel does not overlap with the orthographic projection of the display substrate 10 on the plane of the display panel.

In an exemplary implementation, the second end of the first printed circuit board 41 is connected to the first end of the second flexible printed circuit 32, and the second end of the second flexible printed circuit 32 extends in a direction away from the display panel and then is connected to the second printed circuit board 42 located in an area outside the display panel.

In an exemplary implementation, the orthographic projection of the first printed circuit board 41 on the plane of the display panel may be within the range of the orthographic projection of the protective layer 13 on the plane of the display panel, the orthographic projection of the second printed circuit board 42 on the plane of the display panel does not overlap with the orthographic projection of the display substrate 10 on the plane of the display panel, and the orthographic projection of the second printed circuit board 42 on the plane of the display panel does not overlap with an orthographic projection of the protective layer 13 on the plane of the display panel.

In an exemplary implementation, the display panel may further include fixing tape (Cell Tape) 50, a first end of the fixing tape 50 is attached to a side of the polarization layer 11 away from the display area, and a second end of the fixing tape 50 extends in the first direction D1 to a side of the first printed circuit board 41 in the first direction D1, and is bent around to below the first printed circuit board 41, and then extends in an opposite direction of the first direction D1 to an area where the heat dissipation layer 22 is located, and is attached and fixed to the heat dissipation layer 22. In an exemplary implementation, the fixing tape 50 may serve to fix the display substrate 10 and the first printed circuit board 41 on the one hand, and may serve to protect the bonding-connection on the other hand.

In an exemplary implementation, a thickness of the fixing tape 50 may be about 0.04 mm to 0.06 mm. For example, the thickness of the fixing tape 50 may be about 0.05 mm.

In an exemplary implementation, an opening or a groove may be provided on the fixing tape 50, and the opening or the groove is configured to allow the second flexible printed circuit 32 to pass through for connecting to the second printed circuit board 42.

In an exemplary implementation, the first printed circuit board 41 may include a first board body and a connection line layer arranged on the first board body, a thickness of the first board body may be about 0.25 mm to 0.35 mm, and a thickness of the connection line layer may be about 0.15 mm to 0.25 mm. For example, an overall thickness of the first printed circuit board 41 may be about 0.5 mm.

In an exemplary implementation, since the first printed circuit board 41 is a wiring circuit board mounted with signal connection lines, on which only a plurality of signal connection lines are arranged and no chip-like electronic devices are provided, the first printed circuit board 41 may adopt a single-layer board or a multi-layer board, the number of layers of the multi-layer board being less than or equal to 3, i.e., the first printed circuit board 41 may adopt a structure of a single-layer board, a two-layer board or a three-layer board.

In an exemplary implementation, the second printed circuit board 42 may include a second board body and an electronic device layer arranged on the second board body, a thickness of the second board body may be about 0.8 mm to 1.2 mm, and a thickness of the electronic device layer may be 1.5 mm to 2.5 mm. For example, an overall thickness of the second printed circuit board 42 may be about 3 mm.

In an exemplary implementation, since the second printed circuit board 42 is a drive circuit board mounted with drive chips, on which chip-like electronic devices need to be arranged, the second printed circuit board 42 may adopt a multi-layer board, and the number of layers of the multi-layer board may be about 8 to 10, i.e., the second printed circuit board 42 may adopt a structure of an 8-layer board, a 9-layer board or a 10-layer board.

In an exemplary implementation, a thickness of the first flexible printed circuit 31 may be about 0.05 mm to 0.09 mm. For example, the thickness of the first flexible printed circuit 31 may be about 0.07 mm.

In an exemplary implementation, at the position F1 of the display panel, in the third direction D3 (the bottom-up direction), the display panel may include a fixing tape 50, a heat dissipation layer 22, a back film layer 21, a display substrate 10, a polarization layer 11, an adhesive layer 12 and a protective layer 13.

In an exemplary implementation, taking the case as an example where the thickness of the fixing tape 50 is about 0.05 mm, the thickness of the heat dissipation layer is about 0.2 mm, the thickness of the back film layer is about 0.05 mm, the thickness of the display substrate 10 is about 0.12 mm, the thickness of the polarization layer is about 0.15 mm, and the thickness of the adhesive layer is about 0.2 mm, when cover glass is used as the protective layer, an overall thickness at the position F1 is about 1.37 mm; and when colorless polyimide is used as the protective layer, the overall thickness at the position F1 is about 0.83 mm.

In an exemplary implementation, at the position F2 of the display panel, in the third direction D3, the display panel may include a fixing tape 50, a first printed circuit board 41, a first flexible printed circuit 31, a fixing tape 50 and a protective layer 13. Taking the case as an example where the thickness of the fixing tape 50 is about 0.05 mm, the thickness of the first flexible printed circuit 31 is about 0.07 mm, and the overall thickness of the first printed circuit board 41 is about 0.5 mm, when cover glass is used as the protective layer, the overall thickness at the position F2 is about 1.22 mm, and when colorless polyimide is used as the protective layer, the overall thickness at the position F2 is about 0.68 mm.

In an exemplary implementation, at the position F3 where the second printed circuit board 42 is arranged, the overall thickness of the second printed circuit board 42 may be about 3.0 mm.

In the present disclosure, by a drive separation design of splitting the printed circuit board into a wiring circuit board and a drive circuit board to arrange the wiring circuit board on a side of the display substrate and arrange only signal connection lines on the wiring circuit board, the overall thickness of the display panel is effectively reduced, so that even at the position F1 where the display panel has the largest thickness, the overall thickness is merely 0.83 mm to 1.37 mm. Compared with a conventional structure with an overall thickness of about 3.2 mm to 4.4 mm, an exemplary embodiment of the present disclosure effectively reduces the overall thickness of the display panel, which is only 20% to 30% of the overall thickness of the prior art structure, realizing an ultra-thin structure to the greatest extent.

Figure 12:
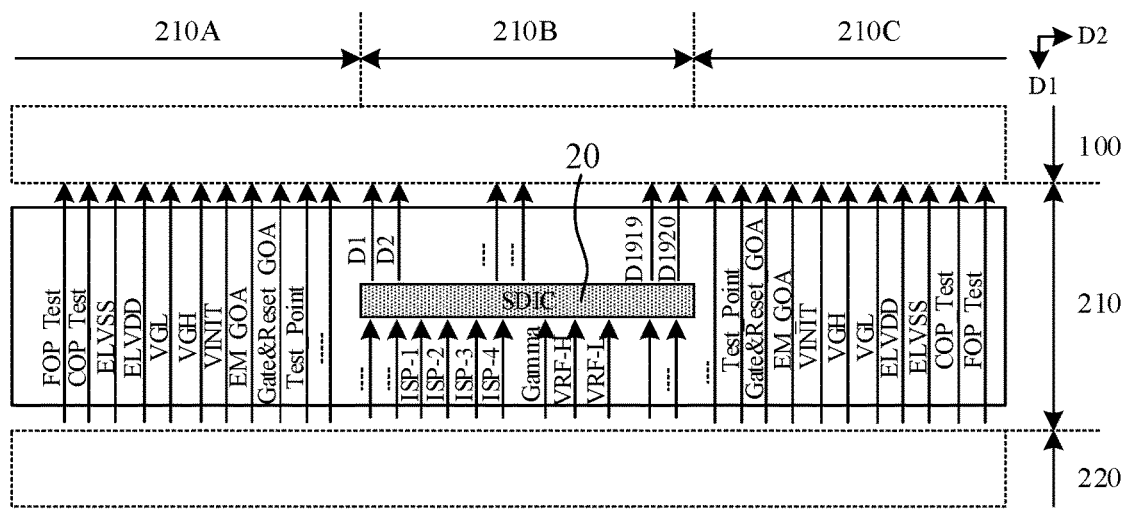
FIG. 12 is a schematic diagram of a structure of a chip region according to an exemplary embodiment of the present disclosure.

FIG. 12 is a schematic diagram of a structure of a chip region according to an exemplary embodiment of the present disclosure. As shown in FIG. 12, in the second direction D2, the chip region 210 may be divided into a first chip sub-region 210A, a second chip sub-region 210B and a third chip sub-region 210C. A plurality of signal leads may be arranged in the first chip sub-region 210A and the third chip sub-region 210C, and a plurality of SDIC chips 20 may be arranged in the second chip sub-region 210B. The plurality of SDIC chips 20 are configured to receive data such as images, videos, system UI, etc. from the T-con chip and generate corresponding data signals according to Gamma and compensation parameters of other various IP read from Flash. In the case where the SDIC chip 20 has a voltage conversion function, the SDIC chip 20 may also generate various GOA signals, such as Gate GOA, EM GOA, Reset GOA, etc.

In an exemplary implementation, the plurality of signal leads in the first chip sub-region 210A and the third chip sub-region 210C may include an FOP_Test lead, a COP_Test lead, an ELVSS lead, an ELVDD lead, a VGH lead, a VGL lead, a VINIT lead, an EM_GOA lead, a Gate_GOA lead, a Reset_GOA lead, a Test Point lead, etc. The COP_Test lead is configured to detect impedance of COP after bonding, the FOP_Test lead is configured to detect impedance of a Flexible on Panel (FOP) after bonding, and the Test Point lead is configured to detect various test points. The ELVDD lead, the VINIT lead and the ELVSS lead are respectively configured to supply a high-level voltage, a reset voltage and a low-level voltage to a plurality of pixel drive circuits in a display area. The VGH lead and the VGL lead are respectively configured to supply a high-level voltage and a low-level voltage. The Gate_GOA lead, the EM GOA lead and the Reset_GOA lead are respectively configured to supply a row scan signal, a row light emitting control signal and a row reset signal to the display area.

In an exemplary implementation, the plurality of signal leads in the first chip sub-region 210A and the plurality of signal leads in the third chip sub-region 210C may be mirror-symmetrical with respect to the second chip sub-region 210B.

In an exemplary implementation, a plurality of input signal lines and a plurality of output signal lines may further be arranged in the second chip sub-region 210B, the plurality of input signal lines may include ISP1 line to ISP4 line, a Gamma line, a VRF_H line, a VRF_L line, etc., and the plurality of output signal lines may include D1, D2, . . . , Dn.

In an exemplary implementation, the ISP1 line to ISP4 line are configured to input image data to the SDIC chip 20, the Gamma line is configured to input a Gamma reference voltage to the SDIC chip 20, the VRF_H line is configured to input a Gamma black state voltage to the SDIC chip 20, and the VRF_L line is configured to input a Gamma white state voltage to the SDIC chip 20.

In an exemplary implementation, for a resolution of 3840*2400, six SDIC chips 20 may be arranged in the second chip sub-region 210B, and output ends of the six SDIC chips 20 are connected correspondingly to the data signal lines in the display area through 1920 output signal lines (D1, D2, . . . , D1920) and fan-out lines.

Figure 13:
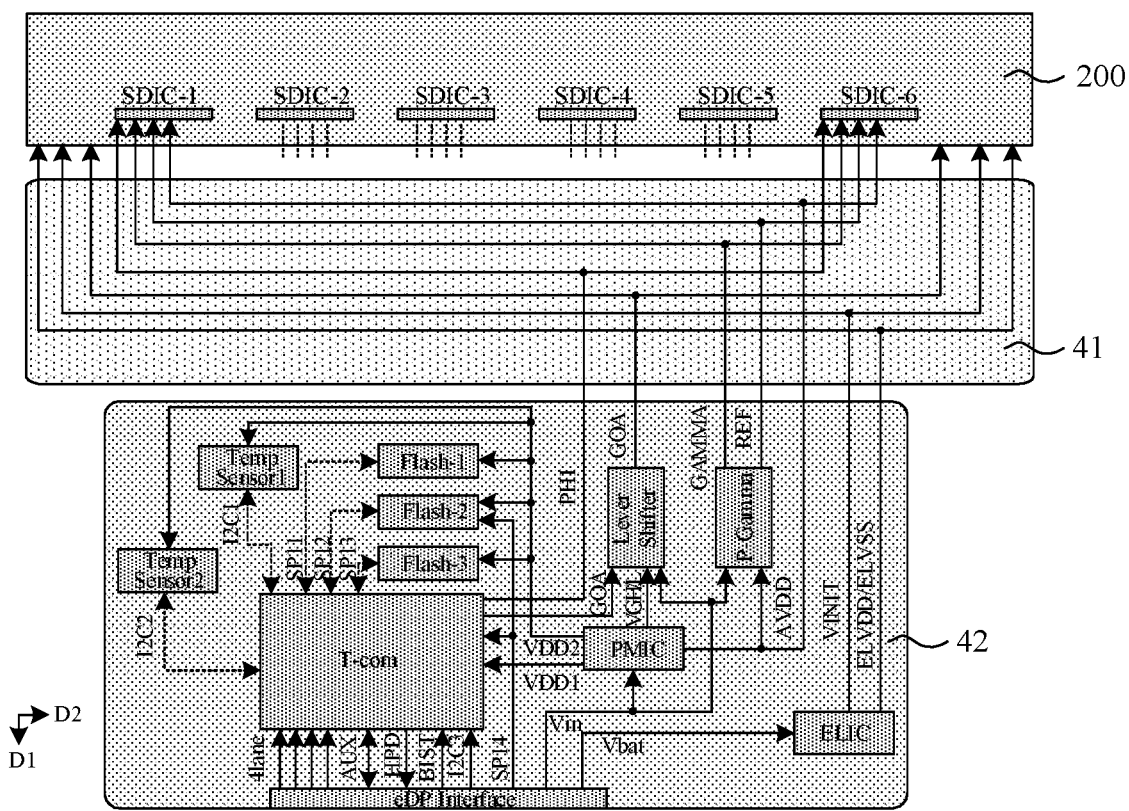
FIG. 13 is a schematic diagram of an equivalent circuit of a printed circuit board according to an exemplary embodiment of the present disclosure.

FIG. 13 is a schematic diagram of an equivalent circuit of a printed circuit board according to an exemplary embodiment of the present disclosure, illustrating equivalent circuit structures of the first printed circuit board 41 and the second printed circuit board 42. As shown in FIG. 13, the first printed circuit board 41 may include a plurality of signal connection lines, and the second printed circuit board 42 may include electronic devices such as a timing control (T-con) chip, a power management (PMIC) chip, a power supply management (ELIC) chip, a reference gamma (P-Gamma) chip, a memory (Flash), a level shifter, a temperature sensor (Temp Sensor), and a connection interface.

In an exemplary implementation, the plurality of signal connection lines on the first printed circuit board 41 are connected to the plurality of signal leads and the input signal lines of the SDIC chip in the bonding area 200 on the one hand, and connected correspondingly to the plurality of chips on the second printed circuit board 42 on the other hand.

In an exemplary implementation, the connection interface may adopt a display interface (eDP) which is configured to realize connection between a drive circuit board and a host. A protocol of the eDP interface may adopt eDP 1.4b, which may include four pairs (Lane) of main links, one auxiliary channel (AUX Chanel), one hot plug detect (HPD) channel, one built-in self-test (BIST) channel, etc. Each pair of main links may be a pair of differential lines to transmit high-speed and large-capacity data, and the data may include images, videos, system UI and other display information. The AUX channel may transmit data with low bandwidth requirements, channel management and device control signals, etc. The HPD channel may act as a hot plug detection channel. The second printed circuit board 42 may be connected to the host through the eDP interface, and the channels for transmitting data signals in the eDP interface are respectively connected to the T-con chip and Flash 2, e.g., a 4-channel Main link, a 1-channel AUX, a 1-channel HPD, a 1-channel BIST and a 1-channel I2C3 connected to the T-con chip, and a Serial Peripheral interface (SPI) connected to Flash 2. The channels for transmitting power signals in the eDP interface are respectively connected with the PMIC chip, the P-Gamma chip, the ELIC chip and the Level Shifter, for example, supplying a 3.3 V input (Vin) voltage to the PMIC chip, the P-Gamma chip and the Level Shifter, and inputting a 6V-21V power supply (Vbat) voltage to the ELIC chip. Vbat may be generated by a battery or a power adapter of the host.

In an exemplary implementation, the power management (PMIC) chip is configured to convert a low voltage input from the host into a digital voltage (VDD), an analog voltage (AVDD), a high/low voltage (VGH/VGL), etc. needed by a device for supplying to corresponding chips. The output of the PMIC chip at least includes: digital voltages (VDD) supplied to the T-con chip, Flash and Temp Sensor, which are generally 1.1 V and 1.8 V; high voltages (VGH) and low voltages (VGL) supplied to the Level Shifter; and analog voltages (AVDD) supplied to the P-Gamma chip and SDIC chip, which are generally 6.5 V to 8V.

In an exemplary implementation, the power supply management (ELIC) chip is configured to convert a variable AC/DC voltage (powered by a battery or a notebook power adapter) input from the host into a voltage needed by the pixel drive circuit and the light emitting device in the display area. For example, the ELIC chip may output ELVDD, ELVSS, VINIT, etc. to the pixel drive circuit in the display area.

In an exemplary implementation, the reference gamma (P-Gamma) chip is configured to generate maximum graytone voltage values at different bands, which are provided to the SDIC chip as a Gamma reference voltage. The P-Gamma chip may output a Gamma voltage and a reference (REF) voltage.

In an exemplary implementation, the Level Shifter is configured to raise a signal level value to a target value without changing a time domain waveform, a relative positional relationship, and a duty ratio. For example, it may be configured to increase a drive level value of each GOA signal. In the present disclosure, by arranging a level shifter on the second printed circuit board 42, the number of pins of the SDIC chip may be reduced, and the number of signal leads and the number of signal connection lines on the bonding area and the first printed circuit board 41 may be reduced.

In the exemplary implementation, Flash 1 to Flash 3 may be connected with the T-con chip through SPI, and after the system and the display panel are turned on, various data in the Flash will be read out by the T-con chip.

In an exemplary implementation, functional modules, such as a graphic Frame Buffer, various IP, read-write registers, power conversion, and logic operation, may be integrated in the T-con chip, which are configured to output data signals such as images, videos, and system UI to each SDIC chip. The data signals output by the T-con chip, such as images, videos and system UI are respectively transmitted to input ends of the plurality of SDIC chips through PHI interfaces, and GOA timing control signals (e.g., Gate GOA, EM GOA and Reset GOA) output by the T-con chip are supplied to the signal connection lines located in the first printed circuit board 41 after level conversion by the Level Shifter, which extend along the border of the display panel after passing through the bonding area, and are connected with the scan signal lines and the light emitting control lines in the display area to control the pixel drive circuits of a plurality of pixel rows in the display area.

In an exemplary implementation, in the case where the SDIC chip has a voltage conversion function, the Level Shifter may not be provided on the second printed circuit board 42. The GOA timing control signal output by the T-con chip may be directly output to the input ends of some of the SDIC chips (e.g., SDIC1 and SDIC6), thereby controlling the pixel drive circuits of a plurality of pixel rows in the display area.

In an exemplary implementation, the display apparatus (e.g., a notebook) may include a host and the aforementioned display panel, the host and the display panel may be connected through a rotation shaft, the host may at least include a motherboard, a keyboard, a battery and a back cover, and the second flexible printed circuit 32 and the second printed circuit board 42 may be arranged at corresponding positions of the host. For example, for a notebook, the second printed circuit board 42 may be fixed on the motherboard or may be arranged between the keyboard and the battery, and the second flexible printed circuit 32 connecting the first printed circuit board 41 and the second printed circuit board 42 may be hidden and mounted in the rotation shaft of the notebook, which will neither affect the overall thickness of the display panel nor affect the overall aesthetics of the notebook.

In the present disclosure, by a drive separation design of splitting the printed circuit board into a wiring circuit board and a drive circuit board to arrange a drive circuit board (the second printed circuit board) that tends to heat up in a corresponding position of the host outside the display panel, color cast of the display panel caused by the heat up of the drive circuit board is effectively avoided, and the display quality is improved. Moreover, reduction in the service life of the light emitting device caused by the heating up of the drive circuit board can be effectively avoided, thus improving the service life of the light emitting device.

Figure 14:
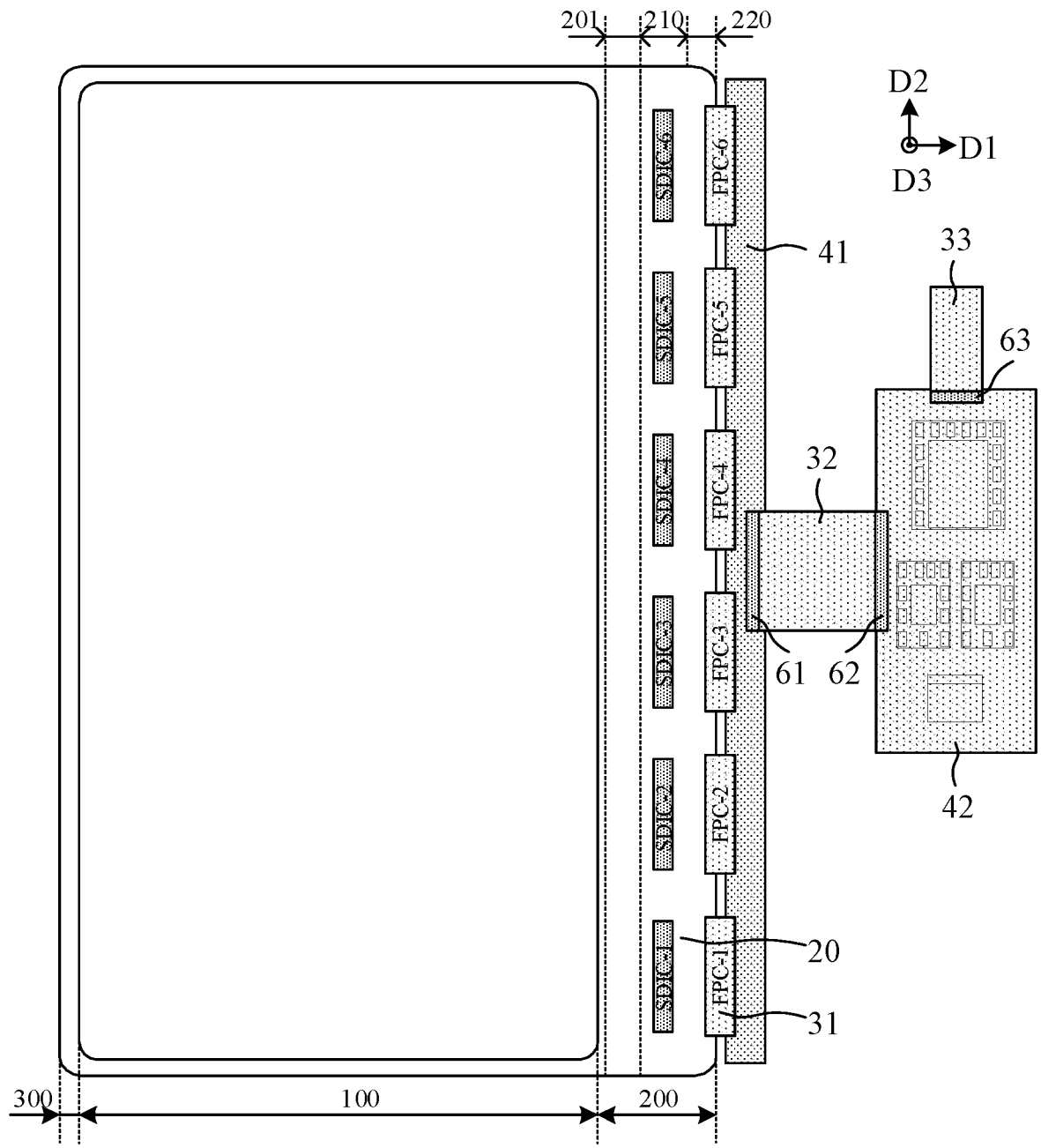
FIG. 14 is a schematic diagram of a planar structure of another display panel according to an exemplary embodiment of the present disclosure.
Figure 15:
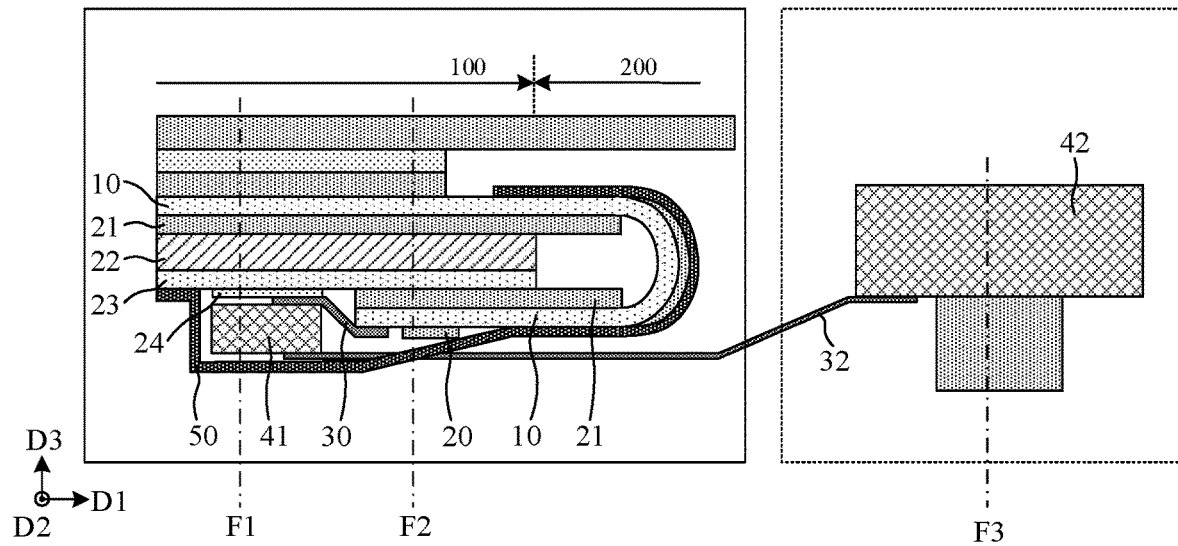
FIG. 15 is a side view of the display panel shown in FIG. 14.

FIG. 14 is a schematic diagram of a planar structure of another display panel according to an exemplary embodiment of the present disclosure, and FIG. 15 is a side view of the display panel shown in FIG. 14. FIG. 14 illustrates an unfolded state before the bonding area is bent, and FIG. 15 illustrates a folded state after the bonding area is bent. As shown in FIG. 14 and FIG. 15, in a plane parallel to the display panel, the display panel may include a display area 100, a bonding area 200 located on a side of the display area 100 in the first direction D1, and a border area 300 located on other sides of the display area 100. The bonding area 200 may include a bending region 201, a chip region 210, and a pin region 220 arranged sequentially in the first direction D1. The bending region 201 is configured to bend in the third direction D3 such that the chip region 210 and the pin region 200 may overlap with the display area 100 in the third direction D3. A plurality of SDIC chips 20 are respectively bonding-connected to the chip region 210, first ends of a plurality of first flexible printed circuits 31 are respectively bonding-connected to the pin region 220, second ends of the plurality of first flexible printed circuits 31 are all connected to the first end of the first printed circuit board 41, and the second end of the first printed circuit board 41 is connected to the second printed circuit board 42 through the second flexible printed circuit 32.

In an exemplary implementation, the connection modes and the connection structures of the SDIC chips, the first flexible printed circuit, the first printed circuit board, the second flexible printed circuit and the second printed circuit board may be substantially the same as those in the foregoing exemplary embodiments, which will not be described further here.

In an exemplary implementation, in a plane perpendicular to the display panel, the display panel may include a display substrate 10, a polarization layer 11 arranged on the display substrate 10, an adhesive layer 12 arranged on a side of the polarization layer 11 away from the display substrate, a protective layer 13 arranged on a side of the adhesive layer 12 away from the display substrate, a back film layer 21 arranged on a side of the display substrate 10 away from the protective layer 13, a heat dissipation layer 22 arranged on a side of the back film layer 21 away from the display substrate, a spacer layer 23 arranged on a side of the heat dissipation layer 22 away from the display substrate, and a backing adhesive 24 arranged on a side of the spacer layer 23 away from the display substrate. In an exemplary implementation, the spacer layer 23 may be located in the display area 100 and a portion of the bonding area 200 close to the display area 100, the backing adhesive 24 may be located in the display area 100, and the structures of other film layers and the positional relationship between the film layers may be substantially the same as those in the foregoing exemplary embodiments.

In an exemplary implementation, before bending, the plurality of pins and the plurality of pads in the bonding area 200 may be arranged on a surface of a side of the bonding area 200 in the third direction D3 (upper surface), and after bending, the plurality of pins and the plurality of pads are located on a surface of a side of the bonding region 200 in an opposite direction (lower surface) of the third direction D3. Thus, the SDIC chip 20 may be located on a side of the bonding area 200 in the opposite direction (lower surface) of the third direction D3 and connected to the plurality of pads, and the first end of the first flexible printed circuit 31 may be located on a side of the bonding area 200 in the opposite direction (lower surface) of the third direction D3 and connected to the plurality of pins.

After extending in an opposite direction (a direction close to the display area) of the first direction D1, the second end of the first flexible printed circuit 31 is connected to the first printed circuit board 41, i.e., the first printed circuit board 41 is located in an area where the display area 100 is located, orthographic projections of the first flexible printed circuit 31 and the first printed circuit board 41 on the plane of the display panel are within the range of the orthographic projection of the display substrate 10 on the plane of the display panel, and the orthographic projections of the first flexible printed circuit 31 and the first printed circuit board 41 on the plane of the display panel are also within the range of the orthographic projection of the display area 100 on the plane of the display panel.

In an exemplary implementation, the first printed circuit board 41 is connected to the first end of the second flexible printed circuit 32, after extending in a direction away from the display panel, the second end of the second flexible printed circuit 32 is connected to the second printed circuit board 42 in a location of the host in an area other than the display panel, the orthographic projection of the second printed circuit board 42 on the plane of the display panel does not overlap with the orthographic projection of the display substrate 10 on the plane of the display panel, and the orthographic projection of the second printed circuit board 42 on the plane of the display panel does not overlap with the orthographic projection of the protective layer 13 on the plane of the display panel, either.

In an exemplary implementation, the display panel may also include a fixing tape 50, a first end of the fixing tape 50 is attached to the display substrate 10 on the outer side of the polarization layer 11, and a second end of the fixing tape 50 extends to the back of the display substrate 10 in the bending direction, extends in the opposite direction of the first direction D1 to a side of the first printed circuit board 41 in the opposite direction of the first direction D1, and is attached and fixed to the spacer layer 23 through the backing adhesive 24. The fixing tape 50 may serve to fix the display substrate 10 and the first printed circuit board 41 on the one hand, and may serve to protect the SDIC chip 20, the first flexible printed circuit 31 and the first printed circuit board 41 on the other hand.

In an exemplary implementation, an opening or a groove may be provided on the fixing tape 50, and the opening or the groove is configured to allow the second flexible printed circuit 32 to pass through for connecting to the second printed circuit board 42.

In an exemplary implementation, a material of the spacer layer 23 may be polyethylene terephthalate (PET), and a thickness of the spacer layer 23 may be about 0.10 mm to 0.16 mm. For example, the thickness of the spacer layer 23 may be about 0.13 mm.

In an exemplary implementation, a thickness of the SDIC chip 20 may be about 0.15 mm to 0.25 mm. For example, the thickness of the SDIC chip 20 may be about 0.2 mm.

In the exemplary implementation, the materials and thicknesses of the display substrate 10, the polarization layer 11, the adhesive layer 12, the protective layer 13, the heat dissipation layer 22, the back film layer 21 and the fixing tape 50 may be substantially the same as those in the foregoing exemplary embodiments, and the structures and thicknesses of the first printed circuit board 41 and the second printed circuit board 42 may be substantially the same as those in the foregoing exemplary embodiments.

In an exemplary implementation, at the position F1 of the display panel, in the third direction D3 (the bottom-up direction), the display panel may include a fixing tape 50, a first printed circuit board 41, a first flexible printed circuit 31, a backing adhesive 24, a spacer layer 23, a heat dissipation layer 22, a back film layer 21, a display substrate 10, a polarization layer 11, an adhesive layer 12 and a protective layer 13, wherein the protective layer 13 may be cover glass (CG) or may be colorless polyimide (CPI).

In an exemplary implementation, for example, the thickness of the adhesive layer is about 0.2 mm, the thickness of the polarization layer is about 0.15 mm, the thickness of the display substrate 10 is about 0.12 mm, the thickness of the back film layer is about 0.05 mm, the thickness of the heat dissipation layer may be about 0.2 mm, the thickness of the spacer layer is about 0.13 mm, the thickness of the fixing tape 50 is about 0.05 mm, the total thickness of the first printed circuit board is about 0.5 mm, and the thickness of the first flexible printed circuit is about 0.07 mm, then, when cover glass is used as the protective layer, an overall thickness at the position F1 is about 2.07 mm; and when colorless polyimide is used as the protective layer, an overall thickness at the position F1 is about 1.53 mm.

In an exemplary implementation, at the position F2 of the display panel, in the third direction D3, the display panel may include a fixing tape 50, an SDIC chip 20, a display substrate 10, a back film layer 21, a spacer layer 23, a heat dissipation layer 22, a back film layer 21, a display substrate 10, a polarization layer 11, an adhesive layer 12 and a protective layer 13. When cover glass is used as the protective layer, an overall thickness at the position F2 is about 1.87 mm; and when colorless polyimide is used as the protective layer, an overall thickness at the position F2 is about 1.33 mm.

In an exemplary implementation, at the position F3 where the second printed circuit board 42 is arranged, the overall thickness of the second printed circuit board 42 may be about 3.0 mm, and the structure, position, etc. of the second printed circuit board 42 may be substantially the same as those in the foregoing exemplary embodiments.

In the present disclosure, by a bending and drive separation design of the bonding area to arrange the wiring circuit board on the back of the display substrate and only arrange signal connection lines on the wiring circuit board, the overall thickness of the display panel is effectively reduced, and the width of the border is also effectively reduced. Even at the position F1 where the display panel has the largest thickness, the overall thickness is only 1.53 mm to 2.07 mm. Compared with a conventional structure with an overall thickness of about 3.2 mm to 4.4 mm, an exemplary embodiment of the present disclosure effectively reduces the overall thickness of the display panel, which is only 40% to 50% of the overall thickness of a prior art structure, realizing an ultra-thin structure to the greatest extent. In the present disclosure, by bending the bonding area, the border width of the display panel is only about 3.1 mm. Compared with a conventional structure in which the border width is about 8 mm to 10 mm, an exemplary embodiment of the present disclosure effectively reduces the border width of the display panel, so that the border width is only 30% to 40% of the border width of a prior art structure, which increases the screen-to-body ratio by about 3%, and is beneficial to realizing full-screen display.

Figure 16:
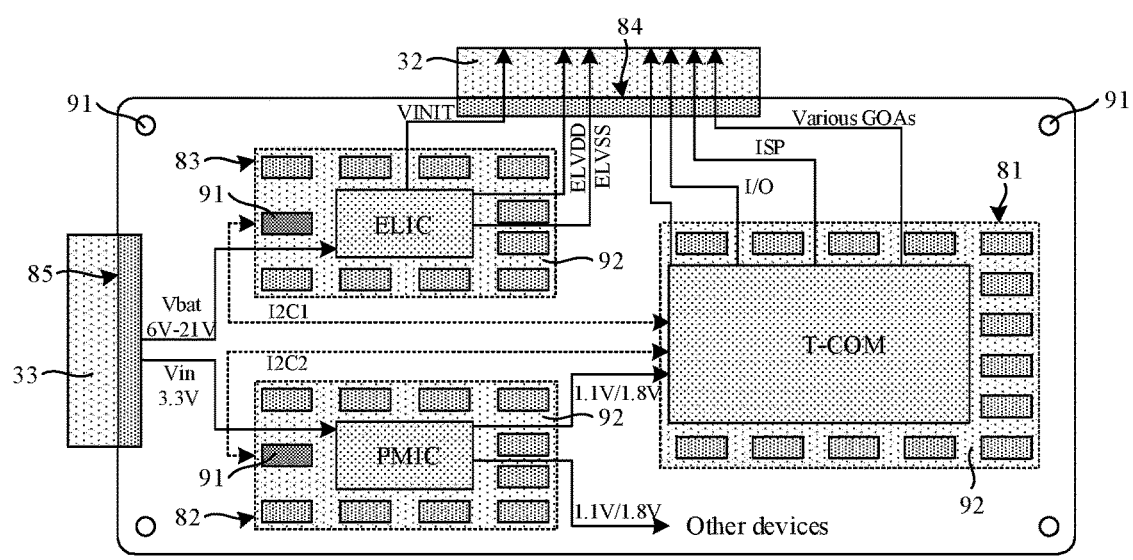
FIG. 16 is a schematic diagram of a structure of a second printed circuit board according to an exemplary embodiment of the present disclosure.

FIG. 16 is a schematic diagram of a structure of a second printed circuit board according to an exemplary embodiment of the present disclosure. As shown in FIG. 16, the second printed circuit board may include a second board body and an electronic device layer arranged on the second board body. The electronic device layer may include a first chip region 81, a second chip region 82, a third chip region 83, a first interface region 84 and a second interface region 85. The first chip region 81, the second chip region 82 and the third chip region 83 are arranged at intervals with a preset distance between adjacent chip regions, and the first interface region 84 and the second interface region 85 may be located at an edge of the second board body.

In an exemplary implementation, the first chip region 81 is configured to arrange a T-con chip and a peripheral circuit thereof (e.g., a resistor, a capacitor, an inductor, etc.), the second chip region 82 is configured to arrange a PMIC chip and a peripheral circuit thereof, the third chip region 83 is configured to arrange an ELIC chip and a peripheral circuit thereof, the first interface region 84 is configured to arrange a second connector for connecting to the second flexible printed circuit 32, and the second interface region 85 is configured to arrange a connection interface for connecting with a cable TV cable or a third flexible printed circuit.

In an exemplary implementation, the second printed circuit board 42 may further include a plurality of fixing holes 91 to improve fixing reliability. For example, the plurality of fixing holes 91 may be respectively provided at corners of the second printed circuit board 42, and the second printed circuit board 42 may be fixed to the motherboard of the host by making screws pass through the fixing holes 91, with the electronic device layer on the second printed circuit board 42 facing a back cover of the motherboard.

In an exemplary implementation, considering that a heat dissipation fan is generally provided on the motherboard of the host, the second printed circuit board 42 may be arranged in a position close to the heat dissipation fan to improve the heat dissipation capability.

In an exemplary implementation, the second printed circuit board 42 may further include a plurality of silicone pads 92 to improve the heat dissipation capability. For example, the silicone pads 92 may be arranged in the first chip region 81, the second chip region 82 and the third chip region 83, a surface of one side of the silicone pad 92 may be attached to the upper surface of the chip and a surface of a peripheral device, and a surface of the other side of the silicone pad 92 may face a back cover of the host, which may effectively improve the heat dissipation in an area that tends to heat up, and improve the working reliability of the chip and the peripheral device.

In the exemplary implementation, a plurality of temperature sensors (Temp Sensor) 93 may further be arranged on the second printed circuit board 42, and the temperature sensor 93 is configured to collect temperature, convert a temperature signal into a digital signal and then transmit it to the T-con chip in an I2C manner.

In an exemplary implementation, one temperature sensor 93 may be arranged in the second chip region 82 and adjacent to the PMIC chip, and another temperature sensor 93 may be arranged in the third chip region 83 and adjacent to the ELIC chip. In the present disclosure, by arranging the temperature sensors in the vicinity of the PMIC chip and the ELIC chip which tend to heat up, a temperature rise in the PMIC chip and the ELIC chip may be accurately measured, so as to facilitate adjusting the display strategy. In some possible exemplary implementations, the temperature sensor 93 may be arranged within the first chip region 81 and adjacent to the T-con chip.

In an exemplary implementation, a temperature adjustment strategy may be provided in the T-con chip to avoid problems such as display color cast or even reduced service life of the light emitting device. For example, after the T-con chip receives a temperature collected by the temperature sensor, whether the temperature is greater than a preset threshold may be determined, and if the temperature is greater than the threshold, the preset temperature adjustment strategy is executed. In an exemplary implementation, the temperature adjustment strategy may include any one or more of: reducing the frame rate, initiating an energy saving mode, limiting the display gray tone, and reducing the display brightness.

The drive circuit board in the present disclosure adopts a modular design to arrange a plurality of relatively dispersed chip regions on the drive circuit board and arrange the T-con chip, the PMIC chip and the ELIC chip in different chip regions respectively, which not only can avoid excessive concentration of heat generation and temperature rise, but also facilitates heat dissipation. By arranging the structures such as temperature sensors and silicone pads, heat generation of the drive circuit board may be effectively controlled, and heat dissipation may also be effectively improved. In the present disclosure, by arranging the drive circuit board in the host, and by the designs of dividing the drive circuit board into different regions, arranging temperature sensors and silicone pads and arranging relevant components close to a fan, etc., the temperature of the drive circuit board may be effectively controlled, thus reducing the influence of temperature rise on the working efficiency of the chips and their affiliated components and improving the conversion efficiency of the power supply, which may further reduce the overall power consumption; and the overall appearance and aesthetics feeling of the display apparatus may be improved, significantly improving the competitiveness of the display apparatus.

The structures shown in the present disclosure are only exemplary descriptions, and the structure and the position of the drive circuit board may be altered according to actual needs, which is not limited here in the present disclosure.

An exemplary embodiment of the present disclosure further provides a display apparatus, including the foregoing display panel.

In an exemplary implementation, the display apparatus (for example, a notebook) may also include a host, the host and the display panel may be connected through a rotation shaft, the host may at least include a motherboard, a keyboard, a battery and a back cover, the second printed circuit board may be fixed on the motherboard or may be arranged between the keyboard and the battery, and the second flexible printed circuit may be hidden and mounted in the rotation shaft of the notebook.

Those of ordinary skills in the art should understand that modifications or equivalent replacements may be made to the technical solutions of the present disclosure without departing from the spirit and scope of the technical solutions of the present disclosure, which shall all fall within the scope of the claims of the present application.

The invention claimed is:

1. A display panel, comprising a display substrate, a first printed circuit board and a second printed circuit board, wherein the display substrate comprises a display area and a bonding area located on a side of the display area, the bonding area is connected with the first printed circuit board through a first flexible printed circuit, and the first printed circuit board is connected with the second printed circuit board through a second flexible printed circuit; and the first printed circuit board is a wiring circuit board mounted with a signal connection line, the second printed circuit board is a drive circuit board mounted with a drive chip, and an orthographic projection of the second printed circuit board on a plane of the display panel does not overlap with an orthographic projection of the display substrate on the plane of the display panel, wherein the first printed circuit board comprises a first board body and a connection line layer provided on the first board body, a thickness of the first board body is 0.25 mm to 0.35 mm, and a thickness of the connection line layer is 0.15 mm to 0.25 mm.

2. The display panel according to claim 1, wherein a first connector is provided on the first printed circuit board, and the second flexible printed circuit is connected with the first printed circuit board through the first connector.

3. The display panel according to claim 2, wherein the bonding area comprises a chip region and a pin region that are sequentially arranged in a direction away from the display area, the pin region comprises a plurality of pins, and the first flexible printed circuit is arranged on a side of the pin region away from the display area and is bonding-connected with the plurality of pins in the pin region.

4. The display panel according to claim 1, wherein a second connector is provided on the second printed circuit board, and the second flexible printed circuit is connected with the second printed circuit board through the second connector.

5. The display panel according to claim 4, wherein the bonding area comprises a chip region and a pin region that are sequentially arranged in a direction away from the display area, the pin region comprises a plurality of pins, and the first flexible printed circuit is arranged on a side of the pin region away from the display area and is bonding-connected with the plurality of pins in the pin region.

6. The display panel according to claim 1, wherein the first printed circuit board is a single-layer board or a multi-layer board, and a number of layers of the multi-layer board is less than or equal to 3.

7. The display panel according to claim 6, wherein the bonding area comprises a chip region and a pin region that are sequentially arranged in a direction away from the display area, the pin region comprises a plurality of pins, and the first flexible printed circuit is arranged on a side of the pin region away from the display area and is bonding-connected with the plurality of pins in the pin region.

8. The display panel according to claim 1, wherein the second printed circuit board is a multi-layer board, and a number of layers of the multi-layer board is 8 to 10.

9. The display panel according to claim 1, wherein the second printed circuit board comprises a second board body and an electronic device layer provided on the second board body, a thickness of the second board body is 0.8 mm to 1.2 mm, and a thickness of the electronic device layer is 1.5 mm to 2.5 mm.

10. The display panel according to claim 9, wherein the electronic device layer at least comprises a first chip region, a second chip region and a third chip region arranged at intervals, the first chip region is configured to provide a timing control chip and a peripheral circuit of the timing control chip, the second chip region is configured to provide a power management chip and a peripheral circuit of the power management chip, and the third chip region is configured to provide a power supply management chip and a peripheral circuit of the power supply management chip.

11. The display panel according to claim 10, wherein the second printed circuit board further comprises at least one silicone pad attached to a surface of the timing control chip, the power management chip, or the power supply management chip.

12. The display panel according to claim 10, wherein the second printed circuit board further comprises at least one temperature sensor, the temperature sensor is arranged in the first chip region and adjacent to the timing control chip; and/or, the temperature sensor is arranged in the second chip region and adjacent to the power management chip; and/or, the temperature sensor is arranged in the third chip region and adjacent to the power supply management chip.

13. The display panel according to claim 1, wherein the bonding area comprises a chip region and a pin region that are sequentially arranged in a direction away from the display area, the pin region comprises a plurality of pins, and the first flexible printed circuit is arranged on a side of the pin region away from the display area and is bonding-connected with the plurality of pins in the pin region.

14. The display panel according to claim 13, wherein the first printed circuit board is arranged on a side of the first flexible printed circuit away from the display area, and an orthographic projection of the first printed circuit board on the plane of the display panel does not overlap with the orthographic projection of the display substrate on the plane of the display panel.

15. The display panel according to claim 1, wherein the bonding area comprises a bending region, a chip region and a pin region that are sequentially arranged in a direction away from the display area, the bending region is configured to turn over the chip region and the pin region to a back of the display area by bending, the pin region comprises a plurality of pins, and the first flexible printed circuit is arranged on a side of the pin region close to the display area and is bonding-connected with the plurality of pins in the pin region.

16. The display panel according to claim 15, wherein the first printed circuit board is arranged on a side of the first flexible printed circuit close to the display area, and the orthographic projection of the first printed circuit board on the plane of the display panel at least partially overlaps with an orthographic projection of the display area on the plane of the display panel.

17. A display apparatus, comprising the display panel according to claim 1.

18. The display apparatus according to claim 17, wherein the display apparatus further comprises a host, the host and the display panel are connected through a rotation shaft, and the second flexible printed circuit is provided in the rotation shaft.

19. The display apparatus according to claim 18, wherein the host comprises a motherboard, a keyboard and a battery, and the second printed circuit board is fixed on the motherboard, or the second printed circuit board is arranged between the keyboard and the battery.

* * * * *